(12) United States Patent
Lindfors et al.

(10) Patent No.: US 6,889,864 B2
(45) Date of Patent: May 10, 2005

(54) SOURCE CHEMICAL CONTAINER ASSEMBLY

(75) Inventors: Sven Lindfors, Espoo (FI); Jan von Zweygbergk, Espoo (FI); Marko J. Kukkonen, Vantaa (FI)

(73) Assignee: ASM International, NV, Bilthoven (NL)

( * ) Notice: Subject to any disclaimer, the term of this patent is extended or adjusted under 35 U.S.C. 154(b) by 166 days.

(21) Appl. No.: 10/187,142

(22) Filed: Jun. 28, 2002

(65) Prior Publication Data

US 2003/0075925 A1 Apr. 24, 2003

Related U.S. Application Data

(60) Provisional application No. 60/302,774, filed on Jul. 3, 2001.

(51) Int. Cl.[7] ............................................. B65D 45/32
(52) U.S. Cl. ....................................... 220/320; 220/322
(58) Field of Search ............................ 220/315, 319, 220/320, 321, 323, 322, 324

(56) References Cited

U.S. PATENT DOCUMENTS

| | | | |
|---|---|---|---|
| 2,640,717 A | | 6/1953 | Scheuring |
| 3,642,166 A | * | 2/1972 | Starr .......................... 220/320 |
| 4,288,001 A | * | 9/1981 | Lankston ..................... 220/316 |
| 4,732,294 A | * | 3/1988 | Bohler et al. ............... 220/320 |
| 5,199,603 A | | 4/1993 | Prescott |
| 5,499,849 A | | 3/1996 | Fend |
| 5,707,089 A | | 1/1998 | Fend |
| 2001/0042523 A1 | | 11/2001 | Kesala |

OTHER PUBLICATIONS

H. Fend, "Progress in Metal Sealing Techniques" XP–002217049, 1996.

* cited by examiner

*Primary Examiner*—Joseph Man-fu Moy
(74) *Attorney, Agent, or Firm*—Knobbe, Martens, Olson & Bear LLP

(57) ABSTRACT

The invention relates to a source chemical container assembly, comprising a metal container functioning as a vacuum chamber and provided with a removable closure, which removable closure seals against the metal container with a metal seal. In order to facilitate easy recharging of the container assembly, compressive force is applied to the metal seal through a tension chain. In a preferred embodiment of the invention the metal seal and the tension chain are provided along a circumference of said metal container. The assembly can comprise an inner container in which the source chemical is contained.

10 Claims, 4 Drawing Sheets

SOURCE CHEMICAL CONTAINER ASSEMBLY

REFERENCE TO RELATED APPLICATION

This application claims the priority benefit under 35 U.S.C. §119(e) to U.S. provisional patent application No. 60/302,774, filed Jul. 3, 2001, the disclosure of which is incorporated herein by reference.

FIELD OF THE INVENTION

This invention relates to the field of source chemical container assemblies to contain source chemicals to be delivered to a reaction chamber to perform vapor deposition or related processes in the reaction chamber.

BACKGROUND OF THE INVENTION

In chemical vapor deposition (CVD) and related vapor deposition techniques, such as atomic layer deposition (ALD), liquid or solid source chemicals are often used. Many of those chemicals react aggressively with moisture and/or oxygen. In order to preserve the purity and volatility of these source chemicals, the container in which they are stored should be vacuum tight to a high degree, compatible with ultra high vacuum (UHV) conditions. It is convenient to use a metal container, which can easily be made UHV compatible and is not susceptible to breakage.

However, the container should also comprise a sealable opening to load the chemical into the container or to remove used material from the container. For this purpose such containers are provided with a removable closure. A polymer O-ring typically cannot be used to seal the removable closure against the container because it is not UHV compatible. Another problem related to the use of polymer O-rings is that polymer O-rings slowly deteriorate in contact with many of the chemicals used in such containers. Furthermore, some of the source materials have such a low vapor pressure that the container has to be heated to a high temperature in order to increase the vapor pressure. Such high temperatures are also harmful to polymer O-rings.

For these reasons, metal seals are the more appropriate to seal the lid against the container and to seal other connections to the container. In such a seal, a metal sealing gasket is sandwiched between two metal flanges. The flanges are made of a hard construction metal, such as stainless steel, and the metal gasket is made of a ductile metal. By pressing the two flanges together, with the sealing gasket therebetween, a high quality seal is formed. However, the two most widely used metals for metals seals, namely aluminum and copper, are also susceptible to attack by many of the source chemicals. Accordingly, a more chemically resistant material, such as nickel, is preferably employed. One disadvantage of nickel is that it is harder and less ductile than aluminum and copper, such that a nickel gasket requires a higher compressive force to maintain the vacuum integrity of the seal.

As shown for the container 10 of FIG. 1, the force for compressing metal gaskets against the container flanges is typically exerted by a large number of nuts 12 and bolts 14, evenly distributed along the circumference of flanges 16, 18, with each bolt sticking through a hole through both flanges 16, 18. When the container 10 needs to be opened or closed a large number of nuts 12 and bolts 14 need to be released or tightened, respectively. This is rather cumbersome, particularly when recharging or discharging the container is performed in a nitrogen purged glove box to avoid exposure of the chemicals to ambient air.

It is accordingly an objective of the present invention to avoid these and other disadvantages and to provide in a vacuum tight metal source container for chemicals used in vapor deposition processes. The container should allow easy, convenient and reliable recharging and discharging.

SUMMARY OF THE INVENTION

The preferred embodiments of the present invention achieve the foregoing and other objectives by providing the metal seal of the removable or openable closure of the container with at least one conical flange and with a tension chain having link parts and thrust pieces. The thrust pieces engage the two flanges so that, upon tensioning the chain, the two flanges are pressed against each other by the thrust pieces.

According to an embodiment of the invention, the removable closure is provided in the bottom part of the container. This allows room at the top of the container for connecting tubing for the outflow of the source chemical in the vapor phase and for the inflow of inert carrier gas. Placing the removable closure at the bottom of the container thus avoids space conflicts.

According to a further embodiment, a first container as described above forms a vacuum chamber, which is provided with an inner container that contains the source chemical. The container can be loaded into and removed from the first container through the closeable opening. A source chemical assembly including such an inner container is described in Finnish application FI 20001166 of applicant, filed on May 15, 2000 and corresponding U.S. publication No. 2001/0042523, published Nov. 22, 2001. Recharging of the container is thus a very simple operation: releasing the tension from the tension chain, removing the tension chain from the flanges, opening the closure and the used metal sealing gasket and replacing the inner container with another inner container having fresh chemicals, putting the closure together with a new metal sealing gasket and the tension chain in place, and tensioning the chain. Such an operation can easily be performed in a glove box.

Metal seals comprising tension chains with thrust pieces to press the flanges together are known. See, e.g., U.S. Pat. No. 5,499,849, issued Mar. 19, 1996 and U.S. Pat. No. 5,707,089, issued Jan. 13, 1998, both to Fend. The disclosures of the '849 patent and the '089 patent are incorporated herein by reference in their entirety. Such devices are commercially available from Evac International, Inc., Switzerland, and are typically used for pressing two flanges of a pipe connection against one another, with a metal sealing gasket between the two flanges. In the preferred embodiments described herein, a closure device similar to that described by Fend for connecting two pipes is used to seal a closure in a metal container for source chemicals used in vapor deposition systems.

As outlined above, copper and aluminum are the most frequently used metals for the sealing gaskets. Because of their ductility, these metals show good sealing properties. For the present source chemical container application, it is preferred to use a nickel gasket, nickel alloy gasket, nickel-coated gasket, precious metal (e.g. gold) coated metal gasket or annealed transition metal (e.g., titanium) gasket, depending upon the source chemical to be stored. Annealing of gasket materials forms dislocations in the metal and annealed metal is softer than metal mechanically treated at low temperatures. Nevertheless, gaskets from metals other than aluminum or copper require a larger compressive force to maintain the integrity of the seal, and hence a more robust tension chain.

BRIEF DESCRIPTION OF THE DRAWINGS

These and other aspects of the invention will be readily apparent from the description below, the appended claims and the drawings, which are meant to illustrate and not to limit the invention, and wherein:

DETAILED DESCRIPTION OF THE PREFERRED EMBODIMENT

Figure 1:
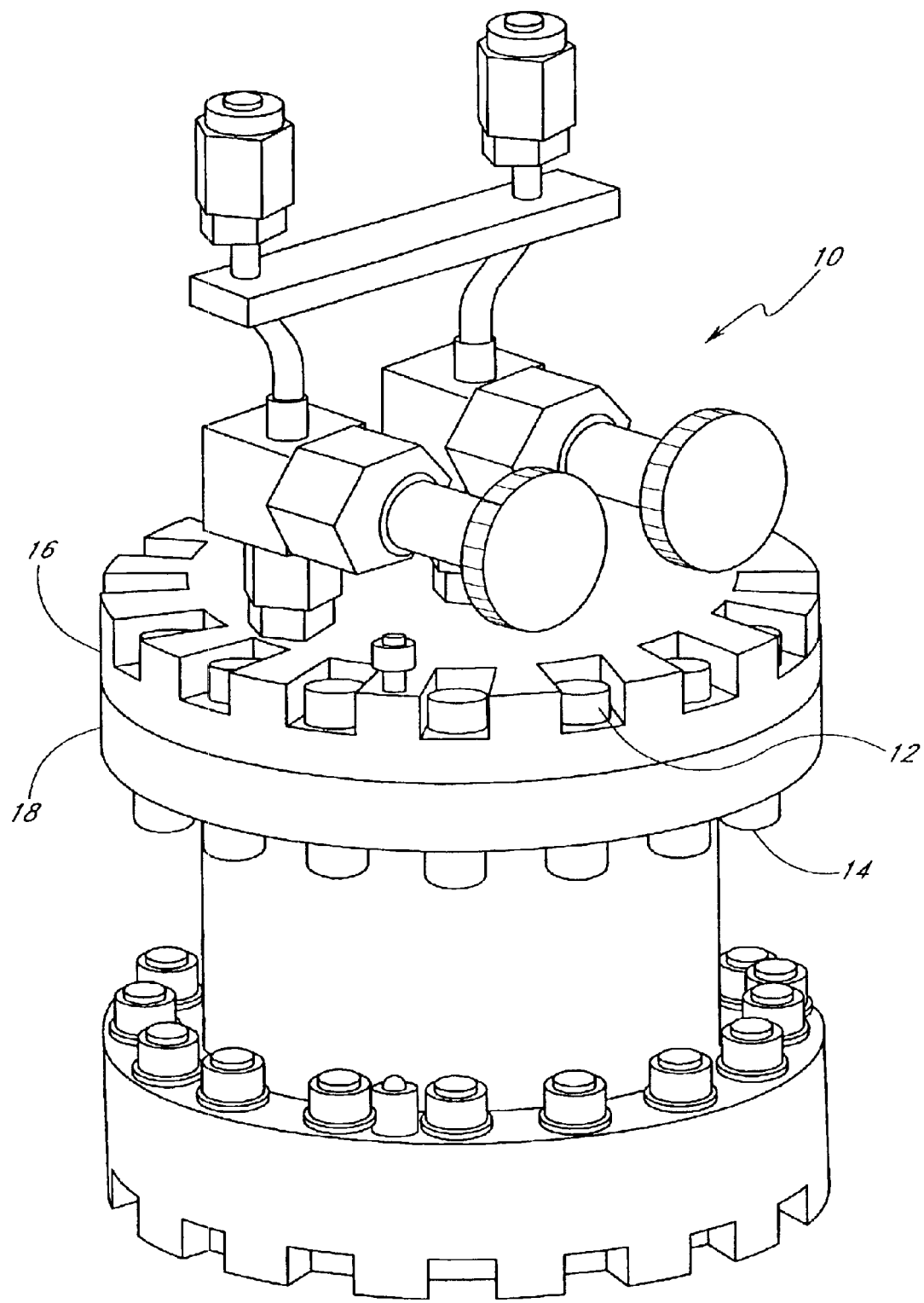
FIG. 1 is an isometric view of a source chemical assembly, constructed in accordance with the prior art.

FIG. 1 illustrates a source chemical assembly 10 according to the prior art. A metal seal (not shown) is applied between two flanges 16, 18, requiring a large number of bolts 14 individually threaded through nuts 12 to be able to apply a sufficiently high force over the whole sealing surface.

Figure 2:
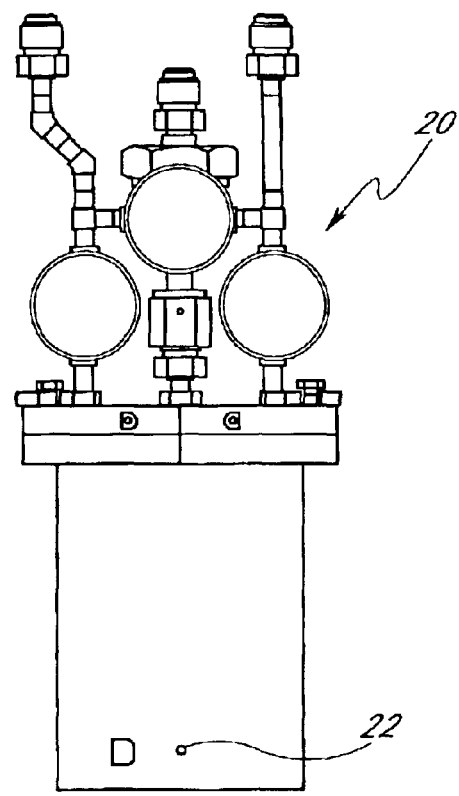
FIG. 2 is a front elevational view of a source chemical assembly, similar to that of FIG. 1, including a conventional closure device and an internal container (hidden) to facilitate rapid charging and discharging of the source chemicals.
Figure 3:
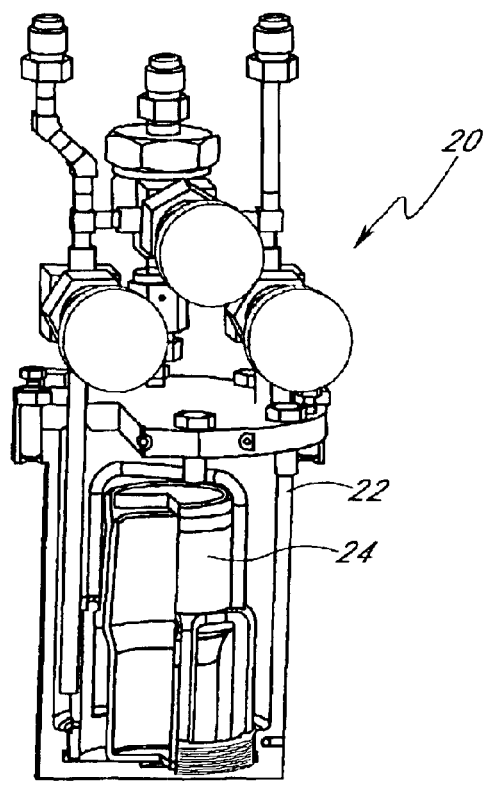
FIG. 3 is an isometric, partially cut-away view of the source chemical assembly of FIG. 2.

FIGS. 2 and 3 illustrate an improvement over conventional source chemical containers used in connection with vapor deposition equipment. In particular, a source chemical container 20 includes an outer container 22 and an inner container 24. The inner container 24, shown in the cut-away view of FIG. 3, facilitates loading and unloading of the source chemical. Such a system is disclosed in co-owned Finnish application FI 20001166, filed on May 15, 2000 and corresponding U.S. publication No. 2001/0042523, published Nov. 22, 2001 (hereinafter "Kesala"), the disclosure of which is incorporated herein by reference.

Figure 4:
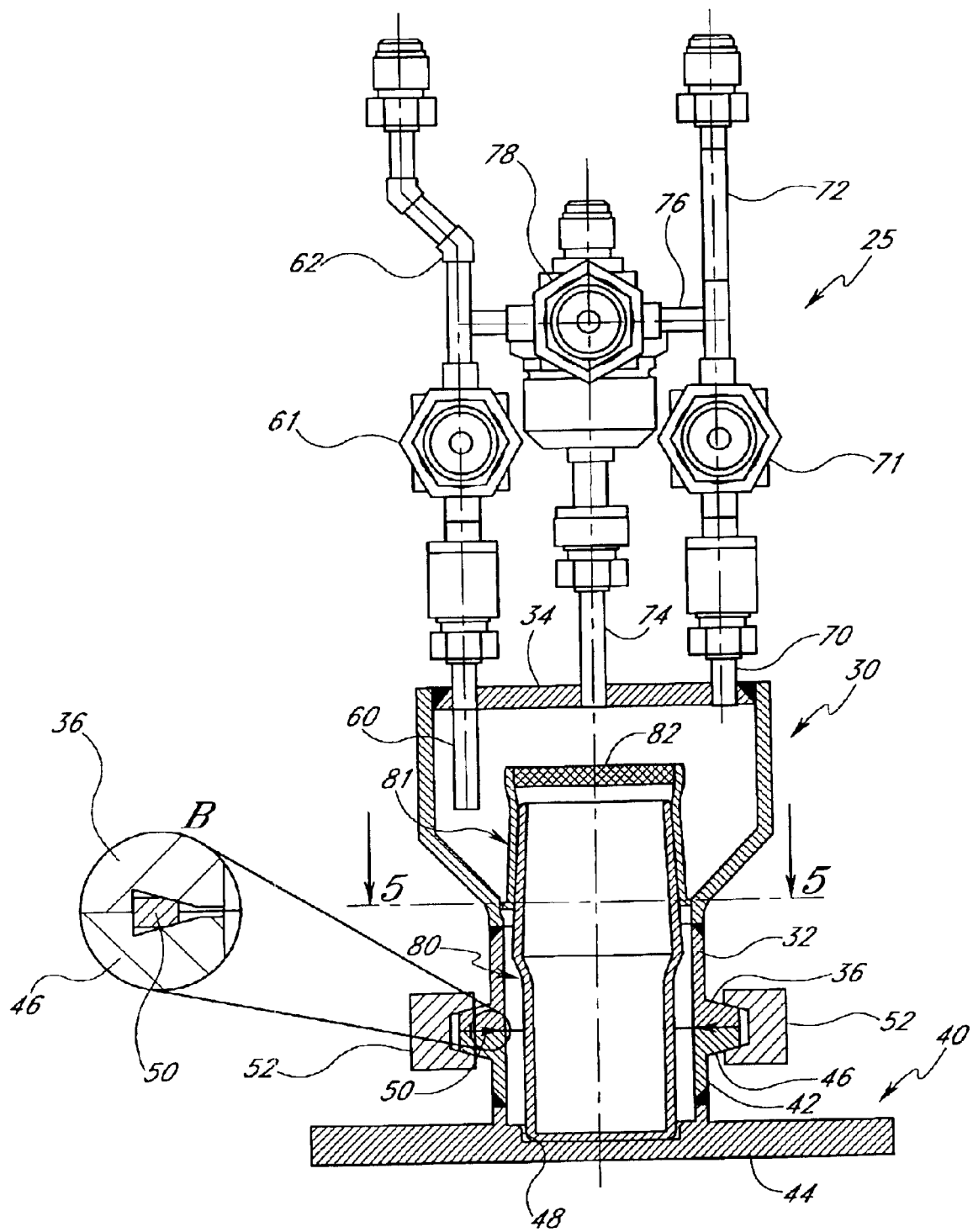
FIG. 4 is an elevational cross section through a source chemical assembly constructed in accordance with a preferred embodiment of the present invention.

FIG. 4 indicates a source chemical assembly in accordance with a preferred embodiment in its entirety by reference numeral 25, and the upper part of the metal container by reference numeral 30. The upper part 30 includes a rotationally symmetrical sidewall 32 and a top wall 34. The sidewall 32 is provided at its lower extremity with a flange 36. While not separately called out in FIG. 4, the skilled artisan will readily appreciate that the source chemical assembly is also provided with heaters, such as those described in Kesala (incorporated hereinabove) in order to vaporize the solid or liquid precursor.

The bottom part of the metal container is indicated by reference numeral 40. The bottom part 40 comprises a rotationally symmetrical sidewall 42 and a bottom wall 44. The sidewall 42 is provided at its upper extremity with a flange 46. The bottom part 40 serves as a closure for the container, as described below. Additionally, the bottom wall 44 includes a recess 48, whose function is discussed in more detail below.

A metal sealing gasket 50 is received between flanges 36 and 46. An expanded view of sealing gasket 50 between flanges 36 and 46 is shown at the left side of FIG. 4. The sealing gasket 50 comprises metal and preferably a metal more resistant to chemical attack than copper or aluminum. In particular, the sealing gasket 50 is preferably formed of nickel, nickel alloy, nickel-coated metal, precious metal (e.g., gold or platinum) coated metal or annealed transition metal (e.g., titanium).

Figure 5:
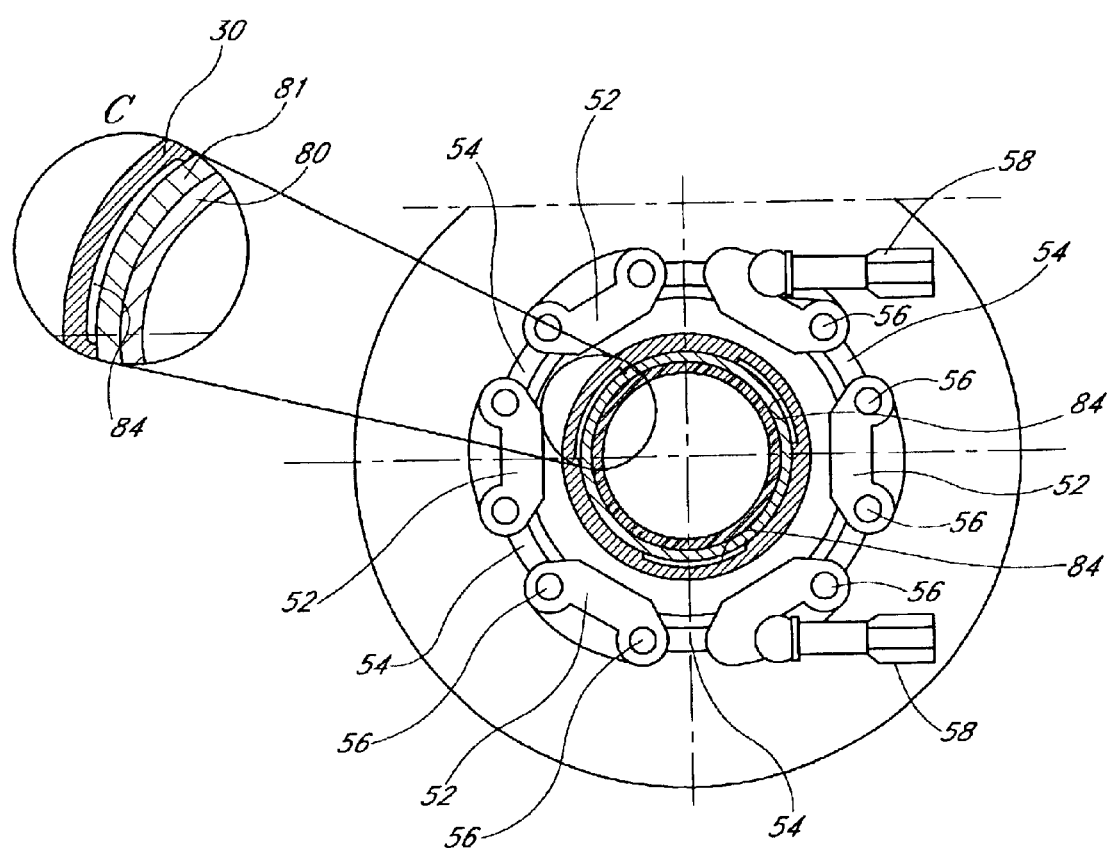
FIG. 5 is a cross-sectional view, taken along lines 5—5 of FIG. 4, illustrating a top view of the tension chain and an enlarged sectional view showing the inner container within the outer container.

Referring to FIGS. 4 and 5, the flanges 36 and 46 are shown pressed against each other by a plurality of thrust pieces 52. As best seen from the view of FIG. 5, the thrust pieces 52 are linked together by link pieces 54 and distributed about periphery of the flanges 36, 46 (FIG. 4). The link pieces 54 are rotatably joined to the thrust pieces 52 by hinges 56. In the illustrated embodiment, the thrust pieces 52 each include two hinges 56. As described in U.S. Pat. No. 5,707,089, issued Jan. 13, 1998 to Fend, the disclosure of which is incorporated herein by reference, the link pieces can alternatively be rotatably joined to the thrust pieces by lugs in one of the pieces and recesses or holes in the other piece. As also disclosed in the '089 patent, link pieces on either side of a thrust piece can be rotatably joined to the thrust piece at the same hinge or lugs. At least one of the link/hinge connections among the thrust pieces 52 is replaced by a tensioning bolt 58, a bore hole through one side of a thrust piece 52 and an internally threaded bore through one of the link pieces 54 or another of the thrust pieces 52. In the illustrated embodiment, two such tensioning bolts 58 are shown.

The thrust pieces 52, link pieces 54, hinges 56 and tensioning bolts 58 together define a tensioning chain. In operation, unscrewing the bolts 58 loosens and allows removal of the tensioning chain. Screwing the bolts 58 back into their respective bore holes connects and then tightens the tensioning chain. As best seen from FIG. 4, the thrust pieces 52 include sloped inner surfaces configured to pinch the flanges 36, 46 together upon application of inward pressure from tightening or tensioning the chain. The embodiment of FIG. 4 shows both flanges 36, 46 being conical, similar to the teachings of U.S. Pat. No. 5,499,849, issued Mar. 19, 1996 to Fend, the disclosure of which is incorporated herein by reference. It will be appreciated that, in other arrangements, one of the flanges can be conical while the other is planar, as illustrated in the '089 patent.

Referring again to FIG. 4, the metal container is provided with a first gas infeed 60 for the inlet of an inactive or inert gas like nitrogen or argon into the metal container and a gas outlet 70 for the outflow of the inactive gas mixed with source chemical. The gas infeed 60 is connected with an inlet conduit 62, which is connected to a source of inactive or inert gas (not shown). An inlet valve 61 is provided along the inlet conduit 62. The gas outlet 70 is connected with an outlet conduit 72, which leads to the reaction chamber in which the CVD, ALD or related process is performed. An outlet valve 71 is also provided along the conduit 72. For additional purge possibilities, conduits 74, 76 and valve 78 are provided.

The source chemical is contained in an inner container 80, which is provided with a lid 81 and communicates with a gas space in the metal container through a porous lid cover 82. While the illustrated lid 81 fits over the inner container 80, it will be understood that the converse arrangement can also be employed. The inner container 80 can be made of glass or any other suitable material that is suitable for contacting the liquid or solid source chemical. As noted above, the recess 48 in the bottom wall 44 of the bottom part 40 is configured to receive and surround the bottom part of inner container 80. As best seen from the enlarged section at the left side of FIG. 5, the upper part 30 of the outer container, and particularly at the point where the sidewall 32 transitions from vertical to conical or flared, includes a plurality of inner grooves 84 to facilitate removal of the inner container 80 from the outer container 30, 40 and replacement thereof. For more details about the inner container 80 and possible alternative embodiments, see U.S. patent publication No. 2001/0042523, incorporated by reference hereinabove.

In operation, when the source chemical within the container assembly 25 is exhausted, the assembly can be readily recharged. In particular, the valves 61, 71 (and, if present, 78) are closed and the assembly 25 is placed in a glove box. A fresh inner container 80 of the desired source chemical, typically in solid or liquid form, is also placed in the glove box, and the glove box is sealed and purged with inert gas. By loosening the tensioning bolts 58, the tensioning chain is loosened and removed from the flanges 36, 46 of the outer container 30, 40. The bottom part 40 is separated from the top part 30 and the entire inner container 80, with exhausted source chemical and any byproducts, is removed and replaced with the fresh inner container 80. A fresh metal gasket is inserted between the flanges 36, 46 and the upper part 30 is replaced over the bottom part 40. The tensioning chain is then reapplied, the bolts 58 are tightened, and the assembly is prepared for further processing.

It will be appreciated by those skilled in the art that various omissions, additions and modifications may be made to the processes described above without departing from the scope of the invention, and all such modifications and changes are intended to fall within the scope of the invention, as defined by the appended claims.

We claim:

1. A source chemical container assembly for source chemicals to be delivered to a reaction chamber for vapor deposition processes, comprising:
    a metal container, having walls defining a vacuum chamber, the container including a first part and a second part;
    the first part being removable to define an opening in the walls of the container, through which opening new material can be loaded into the container or used material can be removed from the container; the first part and second part each provided with a flange designed to form a metal seal when the flanges are pressed against each other with a metal gasket in between them, at least one of said flanges having a conical surface;
    a tension chain comprising link parts provided with thrust pieces, the thrust pieces engaging the two flanges and pressing the flanges against one another when the tension chain is tensioned; and
    a gas outlet leading from the vacuum chamber to the reaction chamber.

2. The source chemical container assembly of claim 1, wherein the metal seal and the tension chain are each provided along a circumference of said metal container.

3. The source chemical container assembly of claim 1, wherein the metal container has an upper wall, a lower wall and a sidewall, the sidewall being substantially rotationally symmetrical and an intersection plane perpendicular to an axis of rotational symmetry cutting the sidewall into the first and second parts, the first and second parts being sealed against each other by the metal seal.

4. The source chemical container assembly of claim 1, further comprising an inner container holding source chemical, the inner container removably loaded into the metal container through the opening.

5. The source chemical container assembly of claim 4, wherein the first part is configured with an inner recess sized to receive a bottom surface of the inner container.

6. The source chemical container assembly of claim 1, wherein the opening is formed proximate a bottom end of the container and a gas inlet and the gas outlet are formed proximate a top end of the container.

7. The source chemical container assembly of claim 1, wherein the metal gasket comprises a material selected from the group consisting of nickel, nickel alloy, nickel-coated metal, precious metal coating another metal, and annealed transition metal.

8. A container assembly for liquid or solid source chemicals for vapor processing, comprising:
    an outer container including an upper part and a lower part, the upper and lower part each comprising flanges configured to seal against one another with a metal gasket therebetween, wherein at least one of the flanges has a sloped outer surface;
    an inner container housed within the outer container, the inner container configured to hold the solid or liquid source chemical; and
    a tension chain arranged to transfer lateral tightening force to a longitudinal sealing force by way of thrust parts interacting with the sloped outer surface of the flanges.

9. The container assembly of claim 8, further comprising a heat source for vaporizing the solid or liquid source chemical.

10. The container assembly of claim 8, wherein the metal gasket is harder and less ductile than aluminum or copper.

* * * * *